United States Patent [19]

Shimbo

[11] Patent Number: 4,960,720

[45] Date of Patent: Oct. 2, 1990

[54] METHOD OF GROWING COMPOUND SEMICONDUCTOR THIN FILM USING MULTICHAMBER SMOOTHING PROCESS

[76] Inventor: Masafumi Shimbo, 31-1, Kameido 6-chome, Koto-ku, Tokyo, Japan

[21] Appl. No.: 88,948

[22] Filed: Aug. 24, 1987

[30] Foreign Application Priority Data

Aug. 26, 1986 [JP] Japan ................................ 61-199281

[51] Int. Cl.$^5$ .................. H01L 21/203; H01L 21/324
[52] U.S. Cl. ............................ 437/105; 148/DIG. 3; 148/DIG. 25; 148/DIG. 48; 148/DIG. 169; 156/610; 437/82; 437/107; 437/108; 437/963
[58] Field of Search ................. 148/DIG. 3, 6, 22, 25, 148/48, 56, 65, 71, 110, 154, 164; 156/610–613; 437/81, 82, , 85, 101, 104, 107, 108, 174, , 939, 963, 973

[56] References Cited

U.S. PATENT DOCUMENTS

| | | | |
|---|---|---|---|
| 3,915,765 | 10/1975 | Cho et al. | 437/107 |
| 4,058,430 | 11/1977 | Suntola et al. | 156/611 |
| 4,071,383 | 1/1978 | Nagata et al. | 437/107 |
| 4,181,544 | 1/1980 | Cho | 437/107 |
| 4,405,435 | 9/1983 | Tateishi et al. | 118/719 |
| 4,464,342 | 8/1984 | Tsang | 437/105 |
| 4,477,311 | 10/1984 | Mimura et al. | 437/105 |
| 4,482,423 | 11/1984 | Besomi et al. | 156/622 |
| 4,493,142 | 1/1985 | Hwang | 437/107 |
| 4,554,030 | 11/1985 | Haisma et al. | 437/107 |
| 4,607,593 | 8/1986 | Van Hemel | 118/719 |
| 4,666,734 | 5/1987 | Kamiya et al. | 118/50.1 |
| 4,713,354 | 12/1987 | Egawa et al. | 437/949 |

OTHER PUBLICATIONS

Neave et al., "Structure and Stoichiometry of (100) GaAs Surfaces During Molecules Beam Epitaxy", J. Crys. Growth, 44 (1978), pp. 387-397.
Wang et al., "Surface Morphologies of GaAs Layers Grown by Ansenic-Pressure-Controlled Molecular Beam Epitaxy", J. Vac. Sci. Technol. B4(1), Jan./Feb. 1986, pp 30-36.
Cho, "Morphology of Epitaxial Growth of GaAs by Molecular Beam Method: . . .", J. Appl. Phys., vol. 41, No. 7, Jun. 1970, pp. 2780-2786.
Parker, The Technology and Physics of Molecular Beam Epitaxy, Plenum Press, New York, N.Y., 1985, pp. 41-55 and 556-563.
Chang et al., "The Growth of a GaAs-GaAlAs Superlattice", J. Vac. Sci. Technol., vol. 10, No. 1, Jan./Feb. 1973, pp. 11-16.
Pessa et al., "Atomic Layer Epitaxy . . .", J. Appl. Phys., vol. 54, No. 10, Oct. 1983, pp. 6047-6050.

*Primary Examiner*—Olik Chaudhuri
*Assistant Examiner*—William Bunch
*Attorney, Agent, or Firm*—Bruce L. Adams; Van C. Wilks

[57] ABSTRACT

In molecular beam epitaxial growth of GaAs substrate, a compound semiconductor thin film having Ga and As is grown by Ga beam and As beam in MBE chamber and then the substrate is transferred to an annealing chamber where the substrate is annealed under As vapor pressure. The above process is repeated to a predetermined layer level whereby it eliminates divergence from stoichiometric.

6 Claims, 2 Drawing Sheets

4,960,720

METHOD OF GROWING COMPOUND SEMICONDUCTOR THIN FILM USING MULTICHAMBER SMOOTHING PROCESS

BACKGROUND OF THE INVENTION

1. Field of the Invention

This invention relates to a molecular beam epitaxial growth method (hereinafter referred to as MBE growth method) of compound semiconductor and apparatus of for making the same.

2. Prior arts

Molecular epitaxial growth of compound semiconductor such as GaAs, InP, or mixed crystals thereof is excellent in terms of controlling film thickness and compositions. Because of this feature, its use is gradually being adopted in the production of high-speed devices such as HEMT and optical devices such as laser diode. In the case of III-V compound semiconductors, for an example, excessive amount of Group V molecular beam is used in order to eliminate deviation from the stoichiometric composition during MBE growth, since the vapor pressure of Group V molecules is generally high. However, it is still hard to eliminate the deviation from the stoichiometric composition, as MBE is not a crystal growth under a thermal equilibrium state. While, a perfect crystal of controlled stoichiometric composition is obtained by a method called "Temperature Difference Method under Controlled Vapor Pressure" which is disclosed in, e.g., Handotai Kenkyu (Semiconductor Research) P.39 and P. 85 of Volume 23 issued by KOGYO CHOSAKAI (Industrial Research Society) in 1985. However, there is a problem in which its application to ultra-thin film growth such as the growth of super lattice is difficult.

SUMMARY OF THE INVENTION

An object of the invention is to eliminate divation from stoichiometric composition, which is a drawback in the conventional method of molecular beam epitaxial MBE growth of compound semiconductors such as described above.

Another object of this invention is to provide a method of growing thin films of compound semiconductor which comprises steps of growing a compound semiconductor thin film composed of at least first molecule or atom particles and second molecule or atom particles by irradiation of at least a first particles beam and a second particle beam of higher vapor pressure on a heated semiconductor substrate in a first vacuum chamber, transferring the substrate while hardly changing the temperature thereof to a second vacuum chamber, and heat-treating the substrate in the vapor of the second molecule under at least controlled vapor pressure.

Still another object of the invention is to provide apparatus for growing thin films of compound semiconductor which comprises a first vacuum chamber, a second vacuum chamber, a substrate secured to a rotatable substrate holder between the first and second vacuum chambers, molecular beam generating means for producing a beam within the first vacuum chamber to irradiate the substrate, a third chamber communicating with the second chamber and functioning as a growing element source, heating means for annealing the substrate within the second chamber under a vapor pressure of the growing element source. Thereby, the thin film is grown successively by thin film deposition in the first vacuum chamber and heat-treatment in the second chamber.

PREFERRED EMBODIMENT OF THE INVENTION

Figure 1:
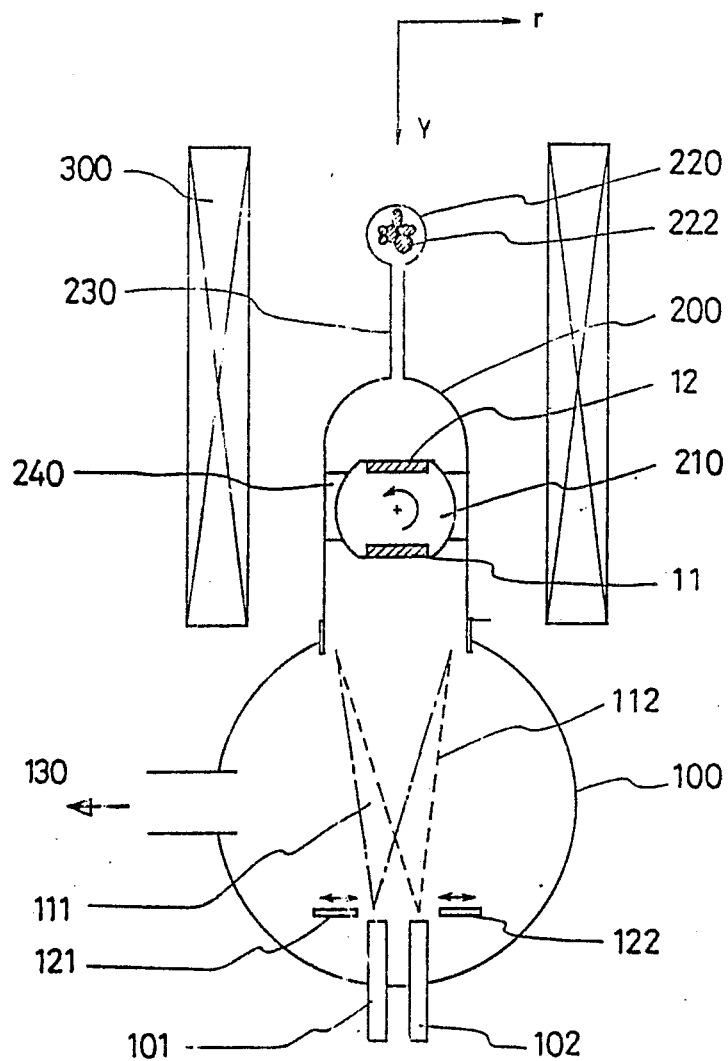
FIG. 1 is a schematic illustration of an apparatus to perform the growth method according to the present invention.

The present invention is described with reference to an embodiment of apparatus as schematically shown in FIG. 1 in which GaAs is grown.

Figure 2:
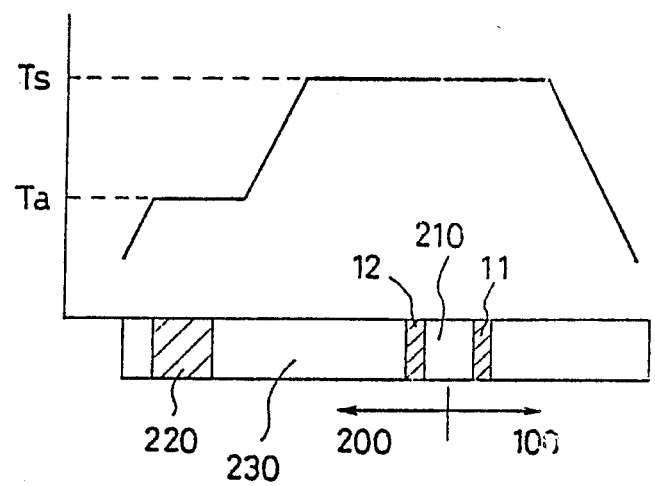
FIG. 2 is a temperature distribution diagram which explains FIG. 1.

The thin film growth apparatus comprises a first vacuum chamber (MBE chamber) 100 and a second vacuum chamber (annealing chamber) 200. Similarly to an ordinary MBE growth apparatus, the MBE chamber 100 is provided with a Ga cell 101 and an As cell for irradiation Ga beam 111 and As beam 112, respectively, onto a substrate 11, and GaAs layer is grown in a predetermined thickness. Then, the substrate 11 is transferred to the annealing chamber 200 where the substrate 11 is annealed under the As vapor pressure. In order to avoid temperature change of the substrate 11 at this stage, the annealing chamber 200 and a substrate holder 210 are heated an electric furnace 300. The annealing chamber 200 has an As chamber 220 communicating therewith through a capillary 230 for introducing As vapor the annealing chamber 200, and is heated by the electric furnace 300 so as to provide the optimum vapor pressure of As 222. In order to perfect this process, the electric furnace 300 provides two temperature levels, the substrate temperature Ts and As chamber temperature Ta as shown in FIG. 2. The As vapor pressure Ps on the substrate 11 is thermally controlled to satisfy the following equations:

$$Ps = PAs \times (Ts/Ta)^{0.5},$$

$$Ps = Pa$$

where PAs is the vapor pressure in the As chamber 220 and Pa is the optimum Group V molecule vapor pressure for GaAs.

In order to efficiently produce thin films, two substrates 11 and 12 are mounted on the substrate holder 210, and they are alternately repeatedly treated in the MBE chamber 100 and the annealing chamber 200. In this manner, the substrates 11 and 12 are periodically transported between the MBE chamber 100 and the annealing chamber 200. As the MBE chamber 100 has to be kept airtight from the annealing chamber 200, the sliding contact surfaces between the substrate holder 210 and bases 240 are sealed by liquid such as $B_2O_3$. Rotation of the substrate holder 210 is controlled from outside by a rotation shaft which is also rotatably sealed by, e.g., $B_2O_3$. If required, suction lines (not shown in the drawing) can also be installed in the annealing chamber 200. The Ga beam 111 alone may be irradiated to deposit Ga on the substrate 11 in the MBE chamber 100, because As is provided under the optimum As vapor pressure in the annealing chamber 200, and GaAs grows under such conditions in the annealing chamber. In this process, the thickness of the Ga deposit is kept less than a layer of some several atoms. If the layer is too thick, polycrystals may be produced during the heat-treatment in the annealing chamber 200 or the growth layer is likely to become uneven. When a compound semiconductor substrate is heat-treated in a controlled Group V molecule vapor pressure, as described in the abovementioned reference document, deviation from the stoichiometric composition can be controlled. It is also applicable to the epitaxial layers grown in the first vacuum chamber, and deviation from the stoichiometric composition can be controlled by heat-treating under the optimum group V molecule vapor pressure in the second vacuum chamber.

The optimum Group V molecule vapor pressure Pa for GaAs is experimentally described as below:

$$Pa = 2.6 \times 10^6 \exp(-1.05 eV/kTs) \text{Torr}$$

In the case of GaP, Pa is:

$$Pa = 2.6 \times 10^6 \exp(-1.01 eV/kTs) \text{Torr}$$

where k is the Boltzmann constant, and Ts is the temperature of the substarate.

Since the growth layer is very thin, heat-treatment can be completed in a short time, and consequently the deposition and the heat-treatment can be alternately repeated easily. In the case of GaAs, when Ga is thinly deposited in a layer of less than several atoms in the first vacuum chamber, and is heat-treated under the As vapor pressure in the second chamber, GaAs layer can be liquid-phase-epitaxially grown at a thickness of several molecules.

According to the present invention as described hereabove, stoichiometrically controlled compound semiconductors are obtained by the MBE growth. As a result, high yield production of high speed devices, photo devices and super-lattice devices as well as integrated circuits of these devices of excellent characteristic and reliability can be realized. While the present invention is mainly described with reference to an embodiment in which GaAs is grown, impurity doping can be also additionally carried out. The method hereinabove described can also be applied to thin film growth of other III-V compounds such as InP, GaP, etc., mixed crystal III-V compounds such as AlGaAs, InGaAsP, etc. and II-VI compounds such as ZnSe, ZnS, HgTe, etc. Further to the MBE, the same idea can be applied to MOMBE, MOCVD, photo-utilized epitaxial growth.

We claim:

1. A method of growing stoichiometric compound semiconductor composed of first and second constituent particles, comprising the steps of: heating a substrate while maintaining the substrate in a first vacuum chamber; depositing a thin layer of first constituent particles on the heated substrate by molecular beam deposition in the first vacuum chamber; transporting the heated substrate having the thin layer deposited thereon from the first vacuum chamber to a second vacuum chamber while maintaining a thermal equilibrium state within the second vacuum chamber; and thereafter contacting the thin layer with a vapor of second constituent particles in the second vacuum chamber while controlling both the pressure of the vapor and the temperature of the substrate to promote reaction between the thin layer and the vapor to thereby effect growth of a stoichiometric compound semiconductor composed of the first and second constituent particles.

2. A method according to claim 1; including controlling both the pressure of the vapor and the temperature of the substrate to effect growth of the stoichiometric semiconductor compound under thermal equilibrium conditions.

3. A method according to claim 1; including maintaining the temperature of the heated substrate while transporting the substrate from the first vacuum chamber to the second vacuum chamber.

4. A method according to claim 3; including periodically transporting the substrate between the first and second vacuum chambers to thereby control the thickness of the grown stoichiometric compound semiconductor.

5. A method according to claim 1; including periodically transporting the substrate between the first and second vacuum chambers to thereby control the thickness of the grown stoichiometric compound semiconductor.

6. A method according to claim 1; wherein the depositing step includes forming the thin layer in a liquid phase on the heated substrate.

* * * * *

UNITED STATES PATENT AND TRADEMARK OFFICE
CERTIFICATE OF CORRECTION

PATENT NO. : 4,960,720
DATED : October 2, 1990
INVENTOR(S) : Masafumi SHIMBO

It is certified that error appears in the above-indentified patent and that said Letters Patent is hereby corrected as shown below:

Title page, insert: item [73] Assignee

-- Seiko Instruments Inc., Japan --.

Signed and Sealed this

Sixth Day of May, 1997

*Attest:*

BRUCE LEHMAN

*Attesting Officer*  *Commissioner of Patents and Trademarks*